(12) United States Patent
Mohanakrishnaswamy et al.

(10) Patent No.: US 8,193,595 B2
(45) Date of Patent: Jun. 5, 2012

(54) METHOD OF FORMING A DIE HAVING AN IC REGION ADJACENT A MEMS REGION

(75) Inventors: Venkatesh Mohanakrishnaswamy, Chennai (IN); Olivier Le Neel, Singapore (SG); Loi N. Nguyen, Carrollton, TX (US)

(73) Assignees: STMicroelectronics, Inc., Carrollton, TX (US); STMicroelectronics Asia Pacific Pte Ltd., Singapore (SG)

( * ) Notice: Subject to any disclaimer, the term of this patent is extended or adjusted under 35 U.S.C. 154(b) by 172 days.

(21) Appl. No.: 12/651,335

(22) Filed: Dec. 31, 2009
(Under 37 CFR 1.47)

(65) Prior Publication Data

US 2011/0156175 A1 Jun. 30, 2011

(51) Int. Cl.
*H01L 27/14* (2006.01)

(52) U.S. Cl. ............... 257/414; 257/506; 257/E29.167; 438/50

(58) Field of Classification Search .................. None
See application file for complete search history.

(56) References Cited

U.S. PATENT DOCUMENTS

| | | | |
|---|---|---|---|
| 7,943,410 B2 | 5/2011 | Le Neel et al. | 438/50 |
| 2009/0302415 A1* | 12/2009 | Mueller et al. | 257/508 |

* cited by examiner

*Primary Examiner* — Thomas L Dickey
*Assistant Examiner* — Scott R Wilson
(74) *Attorney, Agent, or Firm* — Seed IP Law Group PLLC

(57) ABSTRACT

A method that includes forming a first layer having a first dopant concentration, the first layer having an integrated circuit region and a micro-electromechanical region and doping the micro-electromechanical region of the first layer to have a second dopant concentration is presented. The method includes forming a second layer having a third dopant concentration overlying the first layer, doping the second layer that overlies the micro-electromechanical region to have a fourth dopant concentration, forming a micro-electromechanical structure in the micro-electromechanical region using the first and second layers, and forming active components in the integrated circuit region using the second layer.

22 Claims, 14 Drawing Sheets

_US 8,193,595 B2_

METHOD OF FORMING A DIE HAVING AN IC REGION ADJACENT A MEMS REGION

BACKGROUND

1. Technical Field

The present disclosure relates to a method of selectively doping epitaxial layers to form a die having an integrated circuit (IC) region adjacent a micro-electromechanical (MEMS) region.

2. Description of the Related Art

Manufacturers are combining ICs and MEMS devices in single packages to meet consumer demand for smaller devices with enhanced functionality. Generally, the ICs are formed on one wafer and the MEMS formed on another wafer. After the ICs and MEMS are diced, they are electrically connected, sometimes as stacked die in a single package or by being separately packaged and coupled together on a PC board. Differences in processing techniques for ICs and MEMS make it difficult for manufacturers to realize both on a single wafer.

BRIEF SUMMARY

According to principles of the present disclosure, a MEMS region is formed adjacent an integrated circuit (IC) region on a single wafer. Epitaxially grown layers are selectively doped to have different dopant concentrations in the IC region and the MEMS region. For example, a silicon layer is grown or deposited over the entire wafer having a first dopant concentration configured for forming transistors. A mask is formed over the IC region where the transistors are to be formed, leaving a surface of the silicon layer over the MEMS region exposed for processing. The MEMS region is then heavily doped to form a portion of the silicon layer dedicated to forming a MEMS structure.

Forming the heavily doped MEMS region creates a transition region between the IC region and the MEMS region that is related to the thickness of the epitaxial layers. After the MEMS structure is formed, it is protected while the layers are processed to form the transistors or active components in the IC region. The MEMS may be released before or after formation of the active components. With the stratified epitaxial layers, the MEMS structure can be integrated with the active region without affecting or degrading the performance of the device.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
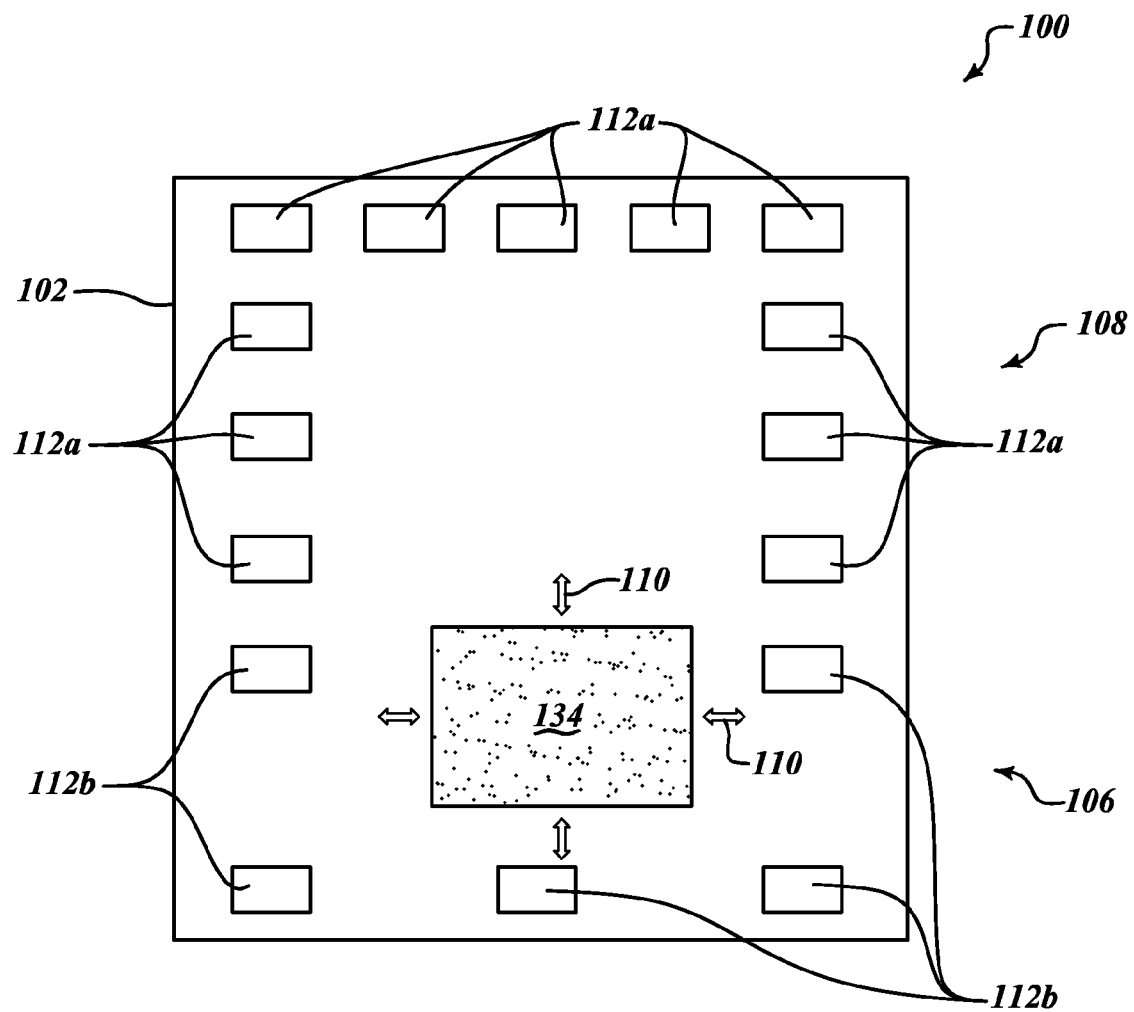
FIG. 1 is a top plan view of a die having an integrated circuit region and a MEMS region, according to an embodiment of the present disclosure.

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

FIG. 1 is a top plan view of a single die 100 that has a micro-electromechanical (MEMS) region 106 adjacent an integrated circuit (IC) region 108 on a substrate 102. The MEMS region 106 is selectively doped to have a higher dopant concentration than the IC region 108. A transition region 110 extends from all sides of the MEMS region 106 as the heavily doped MEMS region transitions to a lower dopant concentration. The transition region 110 between the MEMS region 106 and the IC region 108 may not include any active circuitry or MEMS structure. However, the IC region 108 and the MEMS region 106 may be electrically connected through the transition region 110.

The IC region 108 includes active circuitry formed in an epitaxial layer that has one dopant concentration. The MEMS region 106 includes a MEMS structure 134 formed from a plurality of epitaxially deposited layers having a different dopant concentration than the IC region 108. The active circuitry in the IC region 108 is electrically connected to a plurality of contact pads 112a. The MEMS structure 134 in the MEMS region 108 is coupled to a plurality of contact pads 112b, which are fewer in number than the IC contact pads 112a. The contact pads 112a, 112b are formed from known techniques that will not be described in detail herein.

FIGS. 2-17 are cross-sectional views of a manufacturing process to form the MEMS region 106 adjacent the IC region 108 on the single substrate 102. A layer 116 overlies both a buried oxide 104 region of the MEMS region 106 and a first doped IC portion 114 of the IC region 108. The first doped IC portion 114 is formed to have a first dopant concentration.

The substrate's 102 initial doping concentration and other characteristics are selected based on the IC devices to be formed on the substrate 102. In one embodiment, the substrate is a mono-crystalline silicon wafer that is selectively doped in accordance with the manufacturer's design specifications for CMOS circuits. The substrate 102 may be formed using silicon-on-insulator (SOI) techniques that include forming one or more regions of buried oxide 104 below a surface 118 of the substrate 102.

The buried oxide 104 may be a silicon dioxide layer formed from an ion beam implant of oxygen followed by a high temperature anneal. In this embodiment, the first layer 116 is a thin silicon layer that is about 0.1 microns in thickness. In an alternative embodiment, the buried oxide 104 is formed by wafer bonding where a silicon dioxide insulating layer is formed on the substrate 102 to form the buried oxide 104. A second silicon wafer is bonded to the buried oxide 104 and then thinned to form the first layer 116. The oxide region 104 may also be formed by growing or depositing the oxide in selected locations on the top surface of substrate 102, followed by an epitaxial deposition of silicon to form regions 114 and 116. In such a case, the region 108 will be monocrystalline and of the same crystal as the substrate 102, while the region 106 will be an epitaxially deposited polysilicon sometimes referred to as a pseudo-epitaxial region. In the other two techniques, ion implanted oxygen and wafer bonding, the regions 106 and 108 will both be monocrystalline silicon of the same crystal.

Figure 2:
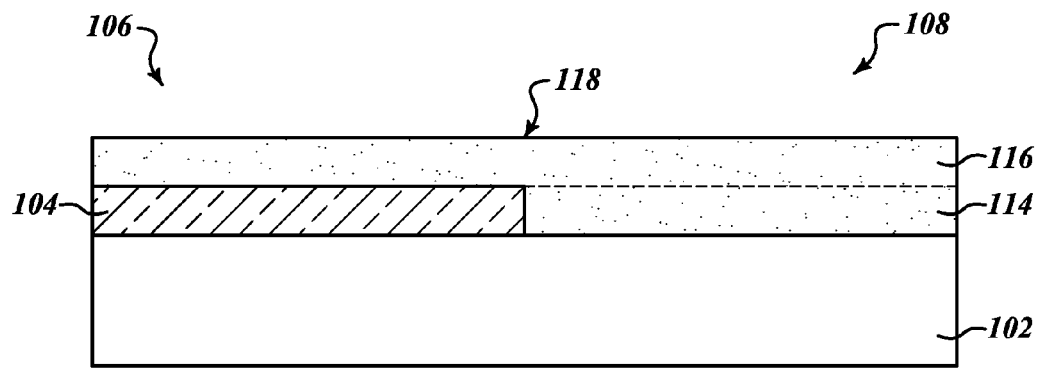
FIGS. 2-17 are cross-sectional views of different stages of a manufacturing process to form an integrated circuit and a MEMS on a single die, in accordance with the present disclosure.

In FIG. 2, the layer 116 is a silicon layer over the buried oxide 104 and the first doped IC portion 114. The buried oxide 104 extends across the entire MEMS region 106 that is adjacent the IC region 108 in one embodiment. In another embodiment, a plurality of buried oxide regions 104 are formed, spaced apart from each other, with monocrystalline silicon substrate 102 on all sides. The first doped IC portion 114 extends across the entire IC region 108. The first layer 116 has a thickness in the range of 2 to 10 microns.

Epitaxy is a well-known technique for growing a single crystal layer onto a substrate or previously formed layer, where the new layer maintains the crystal structure and orientation of the substrate or layer below. During deposition, impurities can be added to the source gas or liquid to form doped epitaxial layers. In one embodiment, the first layer 116 is epitaxially grown to have a second dopant concentration that is the same as the first dopant concentration of the first doped IC portion 114 adjacent the buried oxide 104. The first and second dopant concentrations may also be different dopant concentrations depending on the design of the device.

In an alternative embodiment, the first layer 116 is epitaxially grown on the substrate 102 and then doped by diffusion or ion implantation. Diffusion is a thermal process that introduces dopants, such as boron, phosphorous, or arsenic, into the wafer at temperatures between 800-1100 degrees Celsius. The dopants are moved from the top surface 118 of the substrate, where there is a higher concentration of dopant. A depth of diffusion of the dopants depends on the length of time of an anneal or application of heat.

Ion implantation has been adopted to replace diffusion as the preferred doping technique because of the high, precise temperature requirement of diffusion. Implantation can be performed at relatively low temperatures where subsequent doping layers can be formed without disturbing previously formed doping layers. A beam of impurity ions is accelerated towards the silicon wafer, which causes the ions to disrupt the lattice structure of the atoms of the layer and come to rest at a penetration depth. The lattice damage is easily corrected by heating the wafer, i.e., annealing. Precise doping concentrations can be achieved because the ion beam current can be measured and controlled, resulting in uniform application across a desired area.

Figure 3:
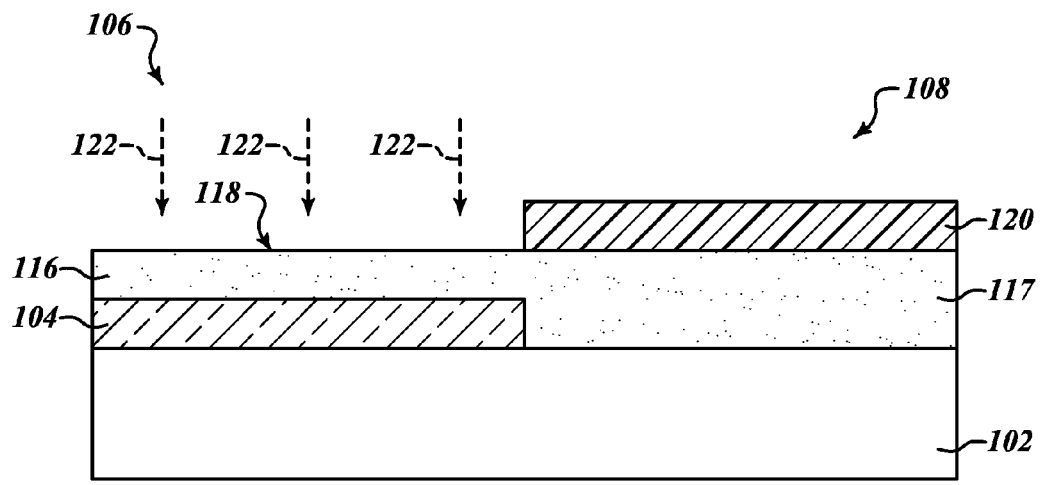

In FIG. 3, the first layer 116 is covered by a photoresist layer 120 patterned to cover the entire IC region 108. The first layer 116 is formed to have the second dopant concentration discussed above. The photoresist layer 120 is aligned with an edge of the buried oxide 104 and exposes the surface 118 of the MEMS region 106. A third dopant 122 is implanted into the exposed surface of the first layer 116. The third dopant 122 is introduced in order to form a first MEMS portion 124 of the first layer 116 to have a higher dopant concentration than a second doped IC portion 117 of the first layer 116.

The first doped IC portion 114 and the second doped IC portion 117 of the first layer 116 are shown to be merged in FIG. 3 because they are formed to have the same dopant concentration, i.e., the first and second dopant concentrations are equivalent. In one embodiment, the layer 117 will be a single, united part of the original substrate 102 in which the buried oxide layer 104 was not formed. In another embodiment, the first layer 116 may be formed to have the second dopant concentration that is different from the first dopant concentration of the first doped IC portion 114.

Figure 4:
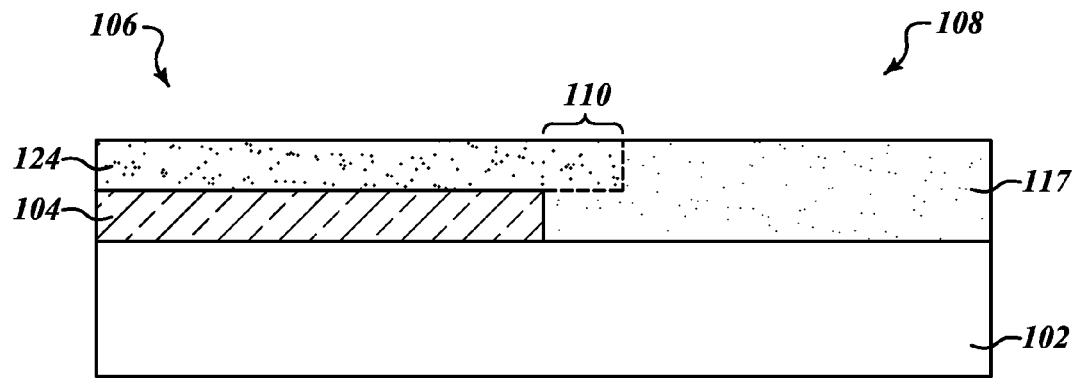

After implanting the third dopant 122 into the first layer 116, the substrate 102 undergoes an anneal to ensure that the third dopant 122 is activated and evenly distributed through the first MEMS portion 124. In FIG. 4, the first MEMS portion 124 has a higher concentration of dopant than the first and second IC portions 114, 117 that relates to the IC region 108. The anneal causes the first MEMS portion 124 to extend past the buried oxide 104 because the second dopant moves equally in all directions for the entire period of time of the anneal. Therefore, the longer the anneal, the further the dopant will move laterally into the second IC portion 117 and the larger the first MEMS portion 124 will become. The extension of the first MEMS portion 124 into the second IC portion 117 forms the transition region 110.

Figure 5:
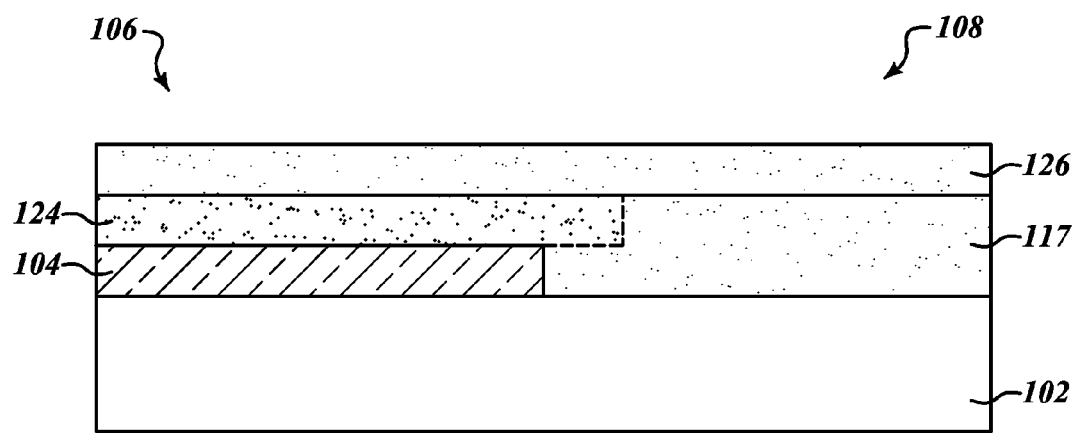

In FIG. 5, a second silicon layer 126 is epitaxially grown overlying the first MEMS portion 124 and the second doped IC portion 117. The second layer 126 may also be formed by an epitaxial process that introduces a fourth dopant during deposition. The fourth dopant is evenly distributed throughout the second layer 126 covering both the MEMS region 106 and the IC region 108. The second layer 126 may be 2 to 10 microns in thickness. The thickness of the first and second layers 116, 126, respectively, are selected based on a desired aspect ratio or height of the MEMS structure 134 to be formed in the first and second layers 116, 126. The height of the MEMS structure 134 may be adjusted to meet design specifications by forming multiple epitaxial layers of various heights.

In one embodiment, the fourth dopant concentration of the second layer 126 is the same as the first and second dopant concentrations of the first and second doped IC portions 114, 117. The layers 102 and 117 may have the doping concentrations of a substrate for CMOS devices on top of which an epitaxial layer is to be formed. Layer 126 will have the channels, as well as the sources and drains, of CMOS devices formed therein and therefore is made with the doping profile preferred for use as the active area for CMOS circuits.

The layer 126 will thereafter have two doped portions, a portion 127 that is doped for CMOS circuits and a portion 132 that is doped for MEMS formation. More particularly the third doped IC portion 127 will have the same dopant concentration as the merged first and second doped IC portions 114, 117. Its doping characteristic will be selected for formation of CMOS circuits directly therein.

In an alternative embodiment, the first, second, and third doped IC portions will have different dopant concentrations. For example, if the substrate 102 is doped to be P type, the first and second doped IC portions 114, 117 may be $N^{--}$ and the third doped IC portion 127 may be $N^{-}$, where is $N^{--}$ is very lightly doped and N⁻ is lightly doped. The first MEMS portion 124 is heavily doped with the third dopant 122.

Figure 6:
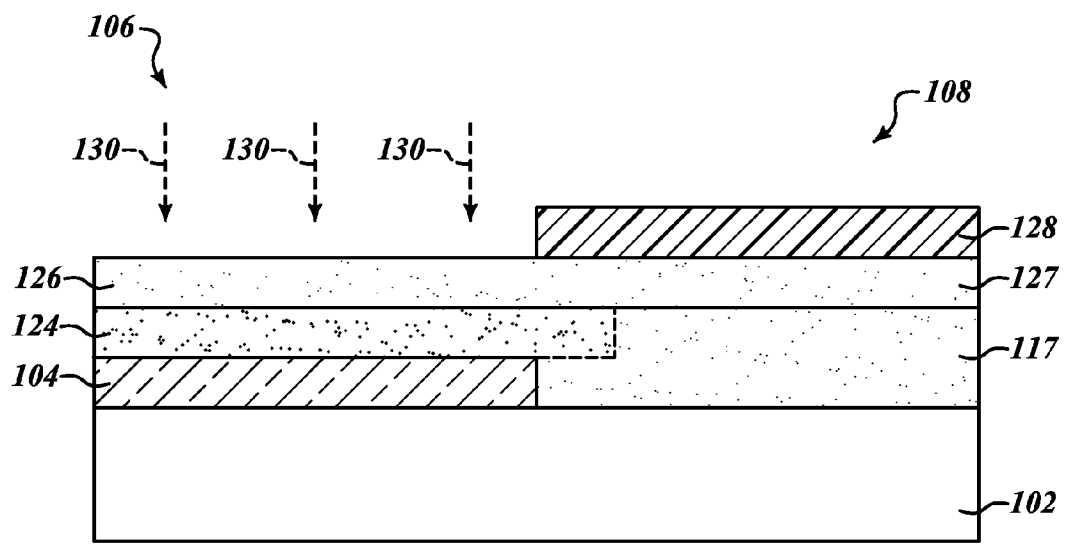
Figure 7:
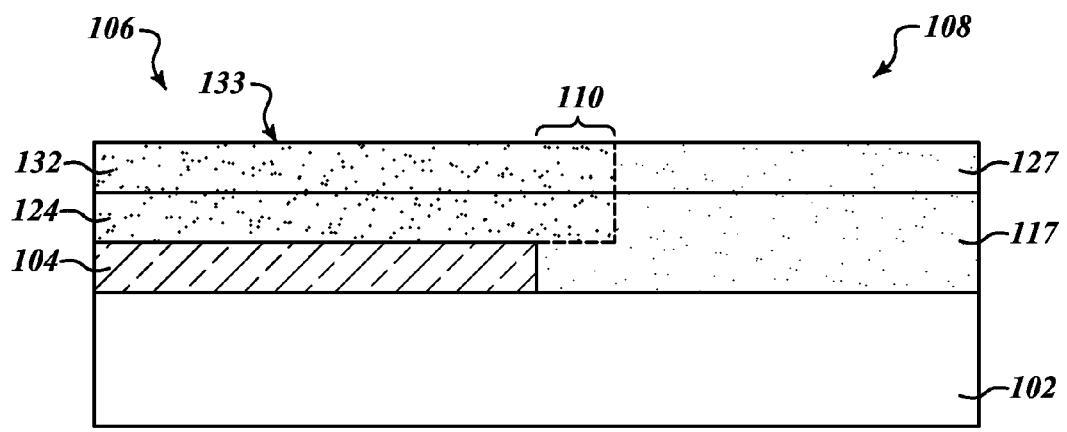

In FIG. 6, a second photoresist 128 is formed overlying the third doped IC portion 127 of the second layer 126 associated with the IC region 108. The second photoresist 128 is sized and shaped to completely cover and protect the IC portion 127 of the second layer 126. A second MEMS portion 132 of the second layer 126 is exposed by the second photoresist 128. A fifth dopant 130 is implanted or otherwise introduced into the exposed second layer 126 to form the second MEMS portion 132 in FIG. 7.

The fifth dopant 130 is distributed throughout the second MEMS portion 132 by an anneal, which causes the dopant to move equally in all directions. In the illustrated embodiment, the transition region 110 is equivalent because similar dopants are implanted and annealed for equivalent lengths of time.

In one embodiment, the fifth dopant is deposited on a top surface 133 of the second MEMS portion 132 of the second layer 126. A specific amount of time is required to drive the fifth dopant through the entire thickness of the second layer 126. Since a width of the transition region corresponds to the amount of anneal time, the width of the transition region relates to the thickness of the second layer 126. In one embodiment, the transition region 110 is two or more times the thickness of the related epitaxial layer.

The first and second layers 116, 126 are illustrated as having equivalent thicknesses, which cause the transition region 110 to have a width that corresponds to the thickness of the two layers. In one embodiment, the transition region 110 of the first MEMS portion 124 will be longer than the second MEMS portion 132 because the first MEMS portion 124 will experience two anneal processes and the dopant will migrate during each anneal. The transition region 110 is a guide to manufacturers regarding where the pure uncontaminated IC portions 117, 127 are located onto which reliable active circuitry can be built.

The transition region 110 between the IC region 108 and the MEMS region 106 consumes real estate on the wafer that cannot be used for specific device features. The manufacturer balances the differences in yields per wafer when the IC and MEMS are formed on a single die and the yields of two different wafers that are diced then packaged as a single chip.

After the doping processes, the stacked first and second layers 116 and 126 have two distinct regions, the MEMS region 106 and the IC region 108. The MEMS region 106 includes the first and second MEMS portions 124, 132 that have a higher dopant concentration, the third and fifth dopant concentrations, than the IC region 108, the first, second, and fourth dopant concentrations. The MEMS portions 124 and 132 are configured to provide the height and doping for the MEMS structure 134 of FIG. 1.

The third and fifth dopant concentrations may be the same dopant concentration or different dopant concentrations. Additional epitaxial layers may be formed on the substrate 102 in accordance with the methods described above. The additional layers may have the same or different dopant concentrations than the MEMS portions 124, 132. The number of layers that are formed and then selectively doped depends on the aspect ratio of the MEMS structure 134. For example, the first and second epitaxial silicon layers 116, 126 overlying the buried oxide 104 provide a sufficient aspect ratio to form the MEMS structure 134. Traditionally, features of a MEMS device are 20 microns in height. In one embodiment, the manufacturer may form the first and second layers 116 and 126 to be 10 microns in thickness each.

Figure 8:
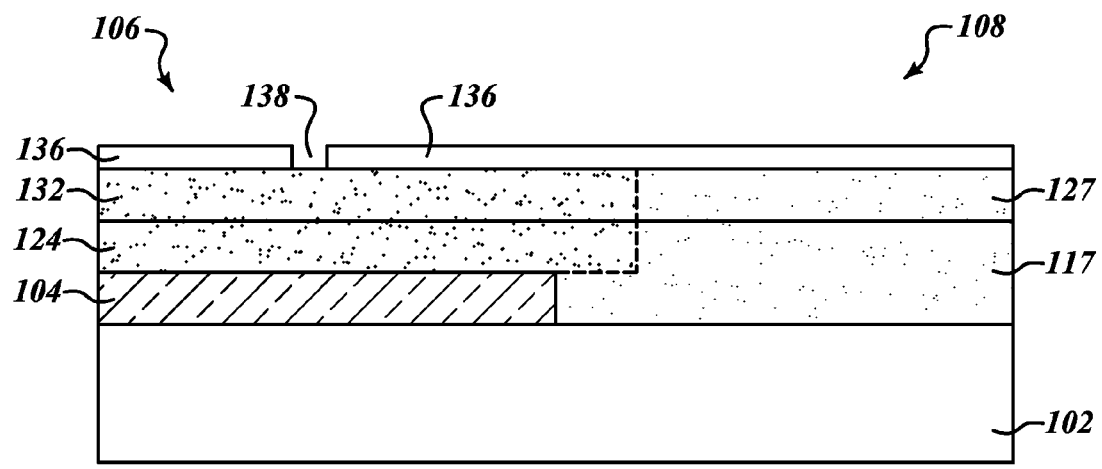

In FIG. 8, a process of forming the MEMS structure 134 begins by depositing or growing a first sacrificial layer 136 overlying the second MEMS portion 132 and the fourth doped IC portion 127 of the second layer 126. In this embodiment, the buried oxide 104 formed from SOI technology is used to form suspended or moveable portions of the MEMS structure 134. The first sacrificial layer 136 may be a thermal oxide, such as silicon dioxide, tetra ethyl ortho silicate (TEOS), borophosphosilicate glass (BPSG), spin-on glass, poly germanium or any suitable sacrificial layer that is removable later in the process. A plasma etch chemical vapor deposition (PECVD) technique may be used to deposit the first sacrificial layer 136. In one embodiment, the first sacrificial layer 136 has a thickness in the range of one to two microns.

Figure 9:
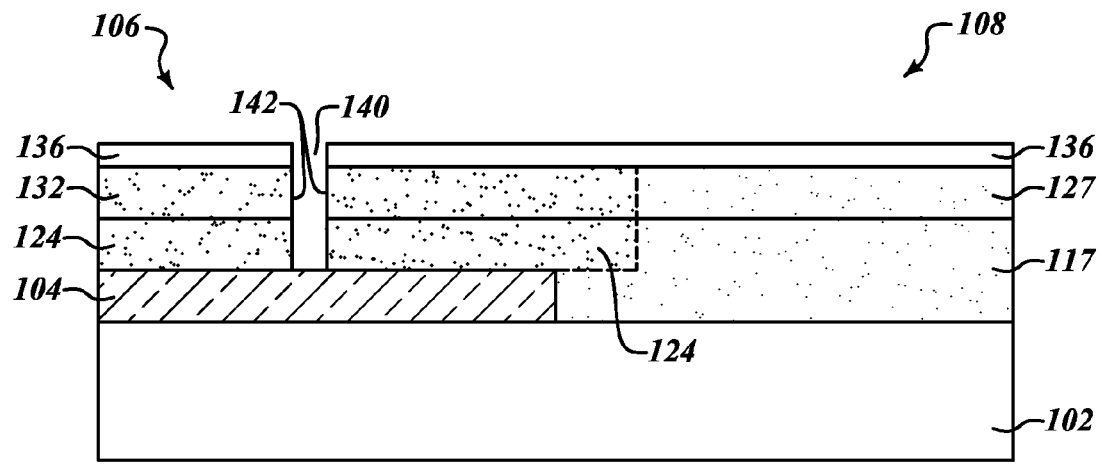

The first sacrificial layer 136 is patterned and etched to form an opening 138. A photoresist layer may be used to define the opening 138. As shown in FIG. 9, the opening 138 defines contours of a recess 140 formed through the first and second MEMS portions 124, 132. The sacrificial layer 136 acts as a hard mask as the first and second MEMS portions are etched. The etch stops at the buried oxide 104, forming walls 142 of the recess 140 by the exposed portions of the first and second MEMS portions 124, 132.

Figure 10:
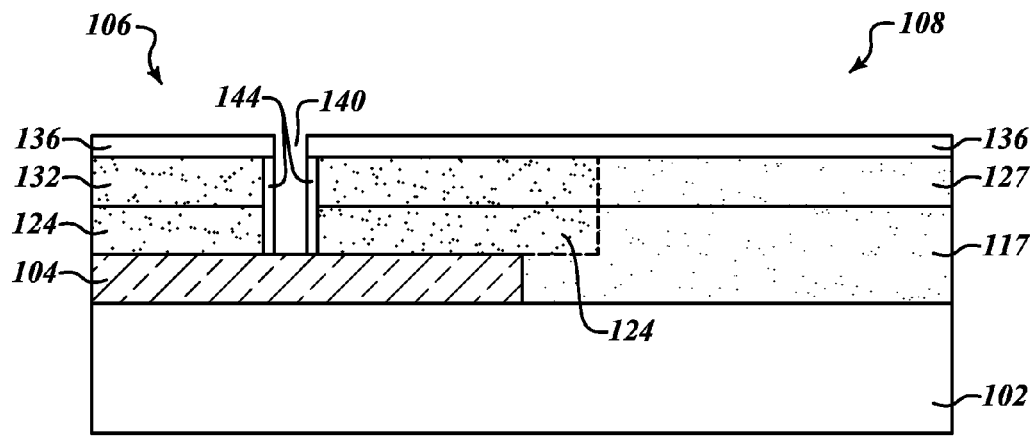

FIG. 10 shows formation of sidewalls 144 that are grown on the walls 142 of the recess 140. The sidewalls 144 are also a sacrificial material, such as silicon dioxide that may be grown or deposited. Growing is preferred if the layer is a silicon dioxide since the thickness can be precisely controlled and will be uniform along the entire wall. Silicon dioxide consumes portions of the walls 142 as it grows, simultaneously consuming and growing at a ratio of approximately 1:1. Therefore, a small portion of the sidewalls 144 may extend into the recess 140.

Figure 17:
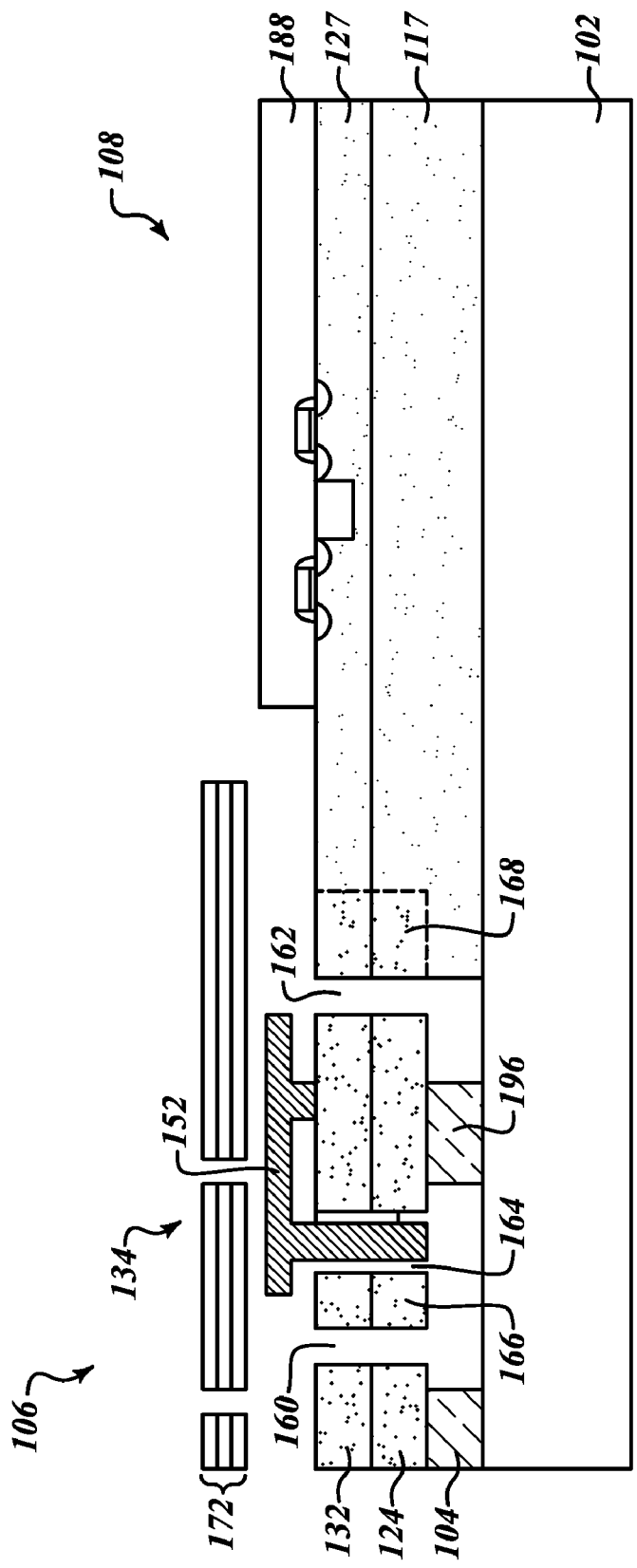

A thickness of the sidewalls 144 may be controlled to optimize performance of the final MEMS device. For example, the thickness may be in the range of 10 to 100 nanometers. The thickness of the sidewalls 144 will determine a width of an opening 164 between a first suspended electrode 166 and a second electrode 152, as shown in FIG. 17.

Figure 11:
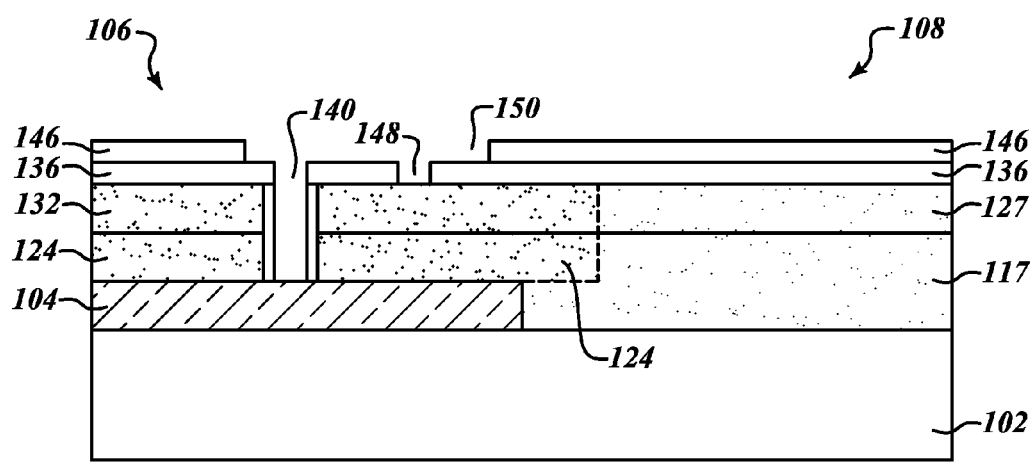

The recess 140 relates to a portion of the electrode 152 of the MEMS structure 134 to be formed. In FIG. 11, other features of the electrode 152 are formed in the first sacrificial layer 136 and a second sacrificial layer 146. A second opening 148 is formed in the first sacrificial layer 136 before the second sacrificial layer 146 is grown or deposited. A third larger opening 150 is formed in the second sacrificial layer 146.

The third opening 150 relates to an anchor connection of the electrode 152. The electrode 152 is formed by depositing a conductive material, such as metal or polysilicon, into the recess 140 and openings 148, 150 in the first and second sacrificial layers 136, 146, respectively.

Figure 12:
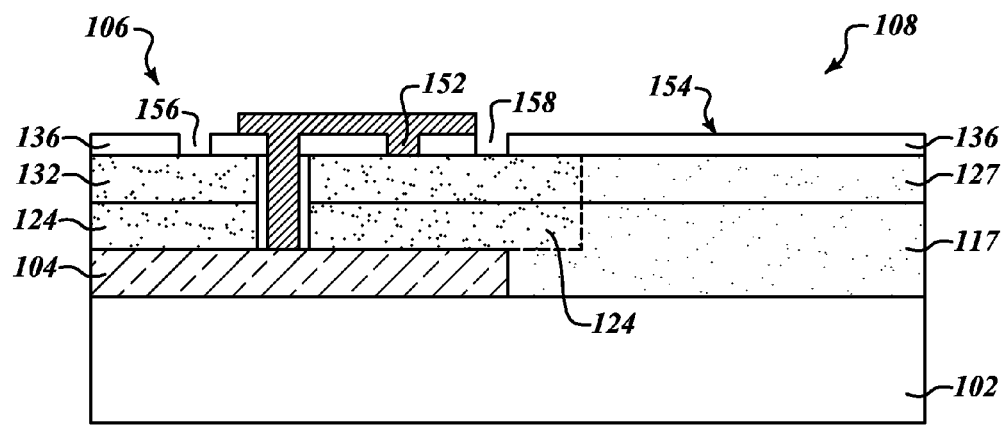

In FIG. 12, the second sacrificial layer 146 is removed to reexpose a surface 154 of the first sacrificial layer 136. Additional openings 156 and 158 are patterned and etched in the first sacrificial layer 136. As with the opening 138 in FIG. 8, the openings 156 and 158 define contours of recesses 160, 162 to form through the first and second MEMS portions 124, 132.

Figure 13:
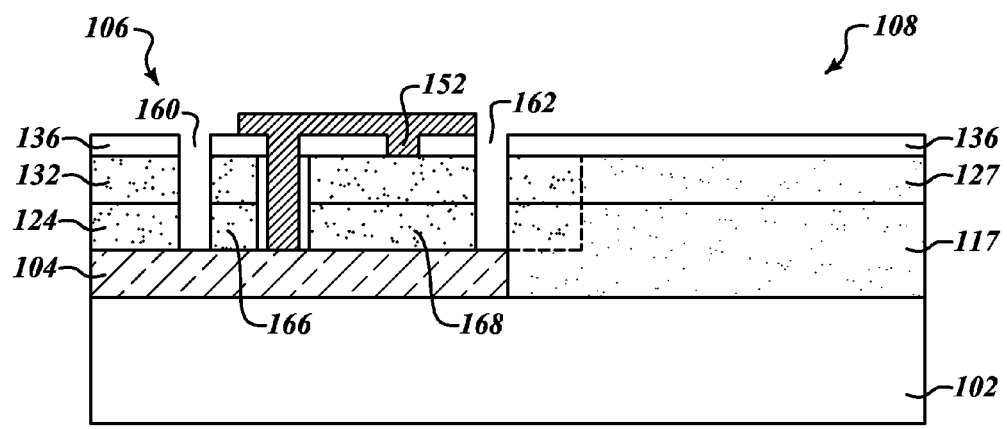

FIG. 13 shows the recesses 160 and 162 etched through the first and second MEMS portions 124, 132 forming the first mobile electrode 166 and an anchor 168. The electrode 152 couples to the anchor 168 through the opening 148.

Figure 14:
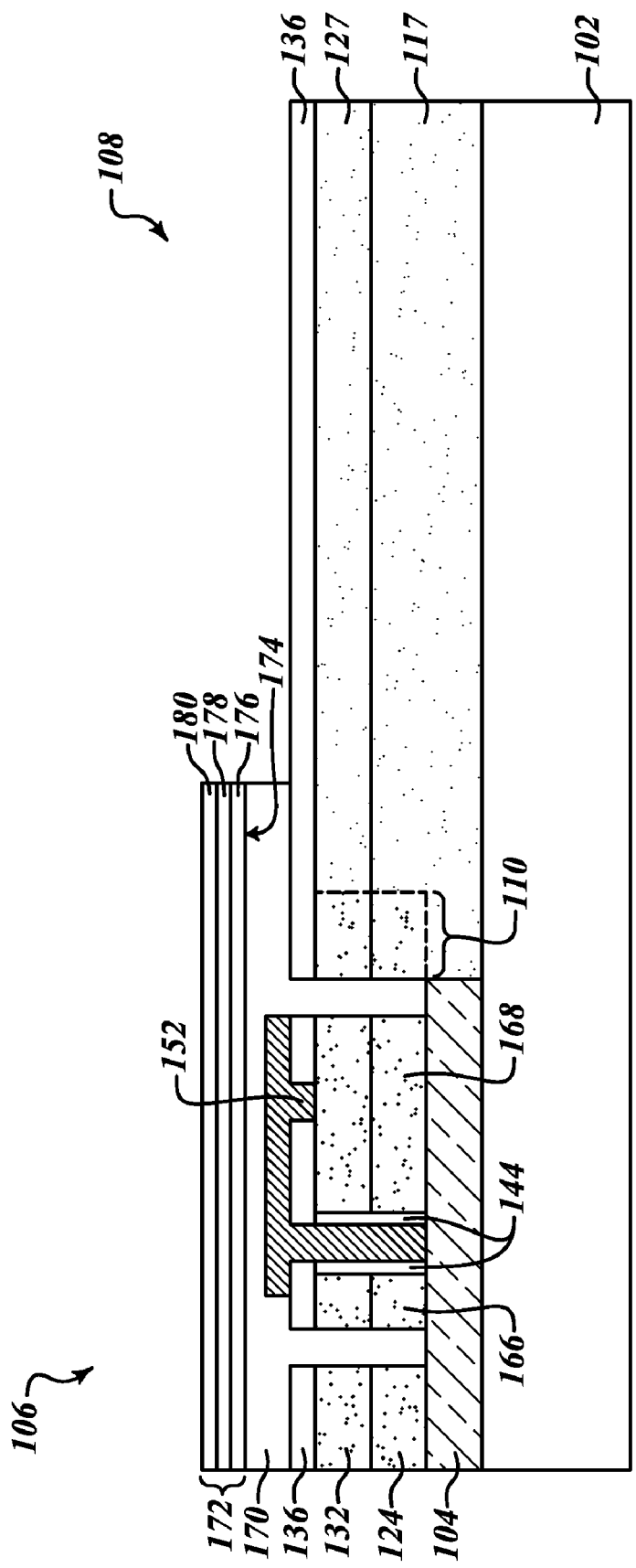

In FIG. 14 a third sacrificial layer 170 is deposited in the recesses 160 and 162 and overlies the second electrode 152 and a portion of the first sacrificial layer 136. The third sacrificial layer 170 is deposited to protect the MEMS structure 134 from processes to form the active circuitry in the IC region 108. The third sacrificial layer 170 may completely cover the transition region 110 or only partially cover the transition region 110. In either embodiment, the entire MEMS region 106 is covered by the third sacrificial layer 170. The third sacrificial layer 170 may be the same material or a different material from the first and second sacrificial layers.

FIGS. 14-17 show a larger portion of the IC region 108 that is adjacent the MEMS region 106. An additional three-layer stack is formed overlying the third sacrificial layer 170 to form a protection stack 172. Prior to forming the protection stack 172, the third sacrificial layer 170 may be chemically mechanically polished to planarize a top surface 174.

The protection stack 172 includes a first polysilicon layer 176, a nitride capping layer 178, and a second polysilicon layer 180, as described in U.S. patent application Ser. No. 12/331,521, which is incorporated herein by reference. The second polysilicon layer 180 is configured to have a selective etch chemistry that is different from the sacrificial layers. The top layer 180 may also be a silicon carbide layer, a nitride layer, or other hard mask.

Figure 15:
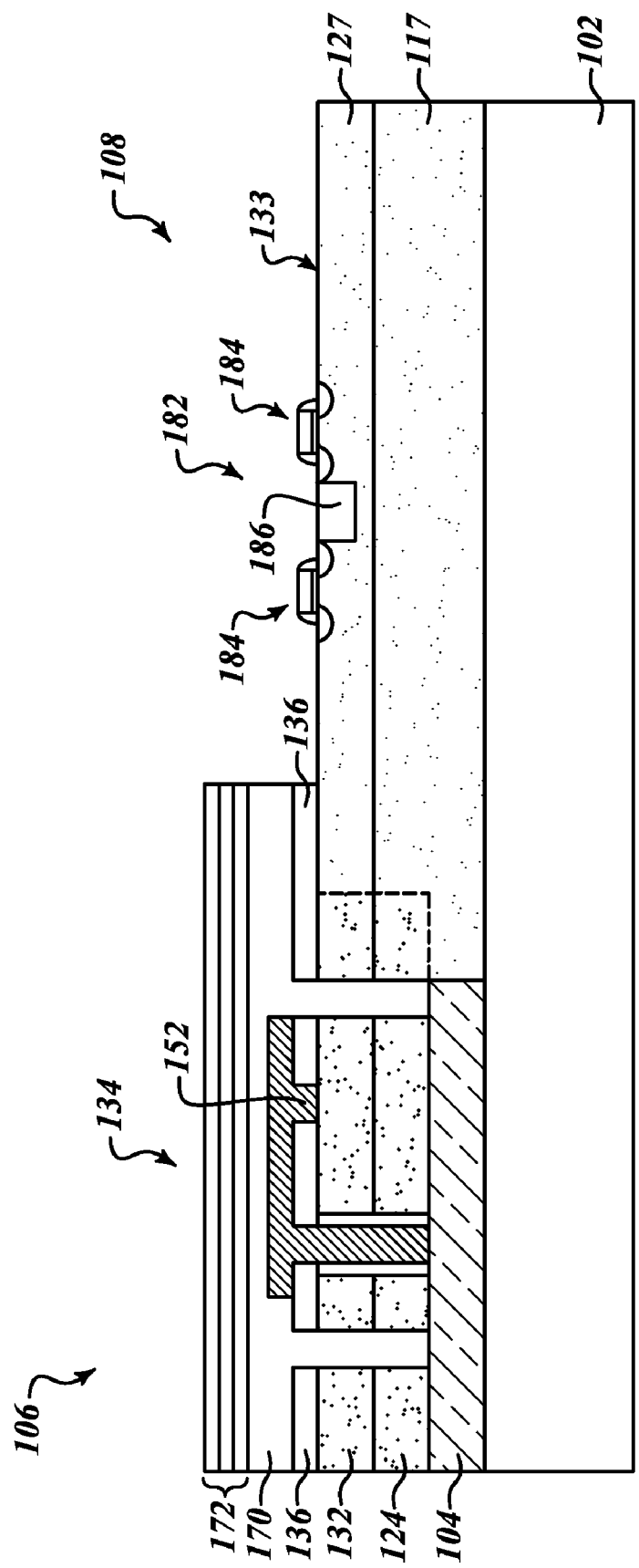

In FIG. 15, the first sacrificial layer 136 that overlies the IC region 108 is removed to expose the top surface 133 of the fourth doped IC portion 127. The protection stack 172 may be used as a hard mask to permit selective removal of the portion of the first sacrificial layer 136 over the IC region 108. The fourth doped IC portion 127 is configured to be used in manufacturing the active circuitry 182 of the IC region 108 that is coupled to the MEMS structure 134. The active circuitry 182, which is simplified for illustrative purposes, includes two transistors 184 separated from each other by an isolation trench 186. Any type of transistor or other active circuitry may be formed in the fourth doped IC portion 127. The dopant concentration of the fourth doped IC portion 127 may be selected to support formation of the desired active circuitry 182. For example, source and drain regions of the transistors 184 can be formed in the lightly doped fourth IC portion 127 without additional doping.

Thin layers of silicon can be used as a thin film for CMOS or other active device fabrication. In one embodiment, the manufacturer may form an additional layer or layers on the surface 133 prior to constructing the active circuitry 182. Methods of manufacturing the transistors and other active circuitry are well known in the art and will not be described in detail herein.

Figure 16:
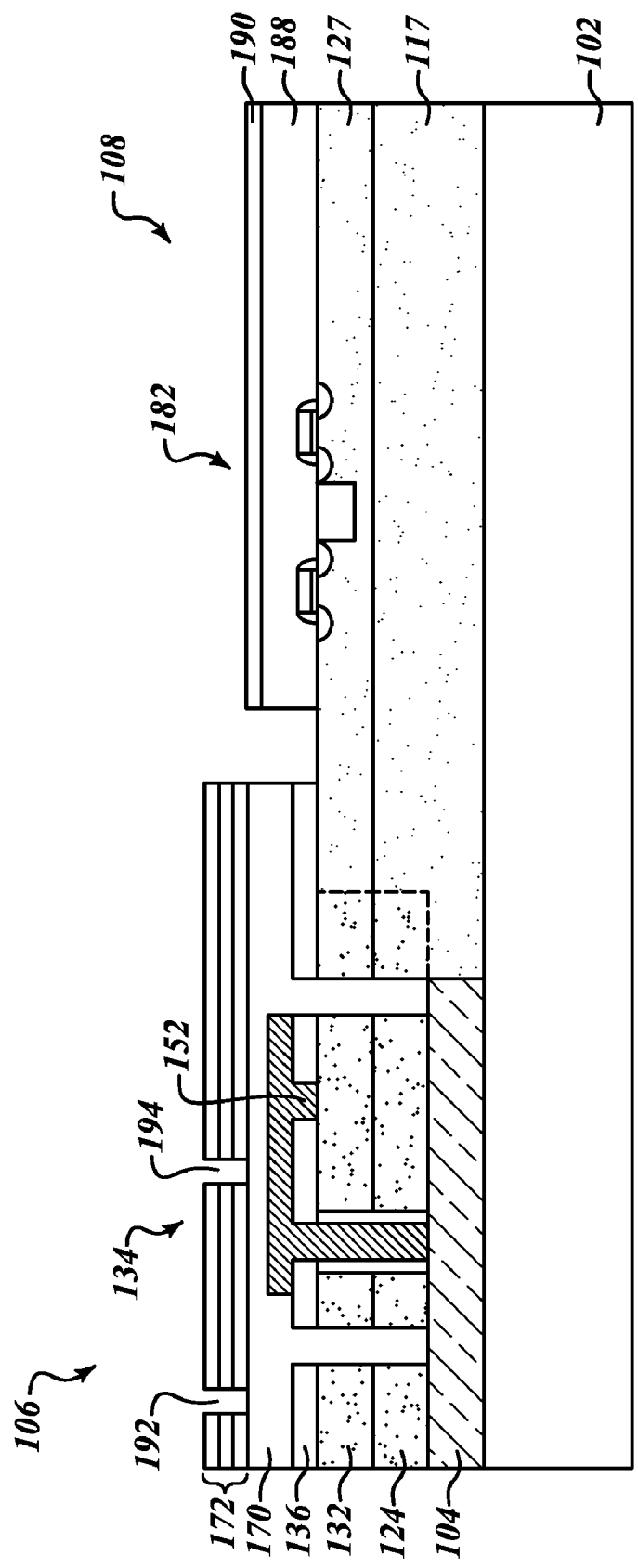

After the active circuitry 182 is formed, an IC protection layer 188 is formed over the transistors 184 and the top surface 133 of the fourth doped IC portion 127 shown in FIG. 16. The protection layer 188 may be an oxide or other material that can be removed at a later stage of the process. The protection layer 188 may be covered by a capping layer 190 that has a selective etch chemistry that is different from the third sacrificial layer 170 in the MEMS region 106. The capping layer 190 will protect the IC region 108 from an etch to release the MEMS structure 134.

Openings 192, 194 are formed through the protection stack 172 to expose portions of the third sacrificial layer 170 that surrounds the MEMS structure 134. The openings 192, 194 are for release of the third sacrificial layer and may be used to form contacts in future process steps, as described in U.S. patent application Ser. No. 12/331,521 mentioned above.

FIG. 17 shows the MEMS structure 134 after an etch is performed to release the MEMS features. A hydrogen fluoride etch may be used to remove sacrificial layers formed from silicon dioxide, TEOS, or BPSG. The etch removes third sacrificial layer 170 overlying the electrode 152 and in the openings 160, 162 and portions of the buried oxide 104. The etch also removes the sidewall 144 from between the first electrode 166 and the fixed electrode 152 to form the opening 164. A portion of the sidewall 144 between the fixed electrode 152 and the anchor 168 is also removed.

The thickness of the combined first and second MEMS portions 124, 132 relate to a desired height of the suspended electrode 166. The height determines a surface area of the suspended electrode 166 that is capacitively coupled to the second electrode 152. The ratio of the surface area to the width of the opening 164 between the two electrodes affects the capacitive coupling of the electrodes, the equation for a capacitor being well known:

$$C = k\frac{A}{d},$$

wherein A is the area of the plates and d is the distance between them, and k is a constant that includes the dielectric constant of the material between the plates.

Capacitively coupled electrodes may be utilized in a variety of applications, such as accelerometers, temperature and pressure sensors, and gyroscopes. For example, the suspended electrode 166 may be configured to deflect in response to an acceleration force. The second electrode 152 detects a change in the capacitance between the two electrodes, and through the active circuitry 182 can transmit a signal related to the detected acceleration force.

The highly doped first and second MEMS portions 124, 132 enable the electrode 166 to be activated for use as a plate of the capacitively coupled electrodes. The active circuitry 182 is coupled to the MEMS structure 134 in another plane not visible in this cross-section. The active circuitry 182 is configured to process the information detected by the MEMS structure 134.

The anchor 168 is electrically coupled to the second electrode 152. Other anchors maybe formed in the process to which other electrodes are electrically connected. Beneath the anchor 168, a portion 196 of the buried oxide 104 remains to connect the anchor to the substrate 102.

Due to the thermal budget constraints of active circuitry, the manufacturer may choose to form the MEMS structure 134 first. However, the same method may be used to form the selectively doped stratified epitaxial layers where the active circuitry is formed before the MEMS structure 134.

Figure 18:
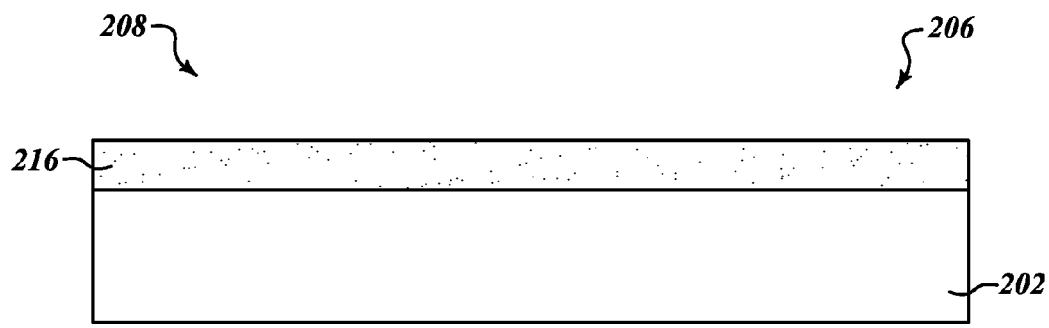
FIGS. 18-22 are cross-sectional views of different stages of a manufacturing process to selectively dope epitaxial layers according to another embodiment of the present disclosure.

FIG. 18 is an alternative embodiment of the method of forming a MEMS region 206 adjacent an IC region 208 on a single substrate 202. A first silicon layer 216 is epitaxially grown on a surface 203 of the substrate 202. The substrate 202 may be monocrystalline silicon onto which the first silicon layer 216 is formed to be a single crystal of the same lattice structure as the substrate 202. The first silicon layer 216 is grown to have a first dopant concentration.

Figure 19:
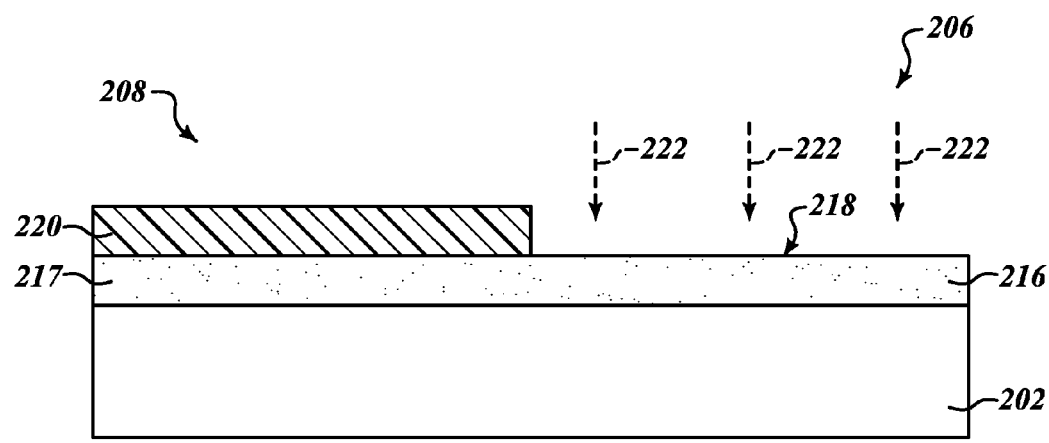
Figure 20:
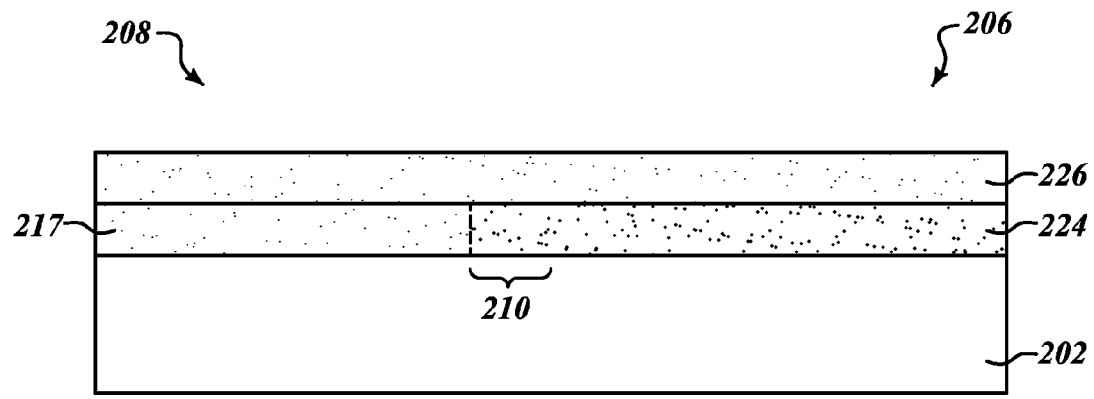

In FIG. 19, a mask layer 220 is deposited and patterned in accordance with known techniques overlying the first silicon layer 216. The mask exposes a top surface 218 of the first silicon layer 216. A second dopant 222 is implanted into the first silicon layer 216 while a first doped IC portion 217 is protected by the mask 220. After the implantation, the substrate 202 is annealed in order to evenly distribute the second dopant 222 through a first MEMS portion 224 adjacent the first doped IC portion 217. The anneal forms a transition region 210 because the second dopant moves equally in all directions for a length of the anneal.

A second silicon layer 226 is epitaxially grown overlying the first doped IC portion 217 and the first MEMS portion 224. The second silicon layer can be formed as a single crystal that matches the lattice structure of the substrate 202 and the first silicon layer 216. In another embodiment, the second silicon layer 226 can be made from a pseudo-epitaxial process to form a poly crystalline structure. The second silicon layer 226 is formed to have a third dopant concentration that may be same as or different from the first dopant concentration of the first doped IC portion 217.

Figure 21:
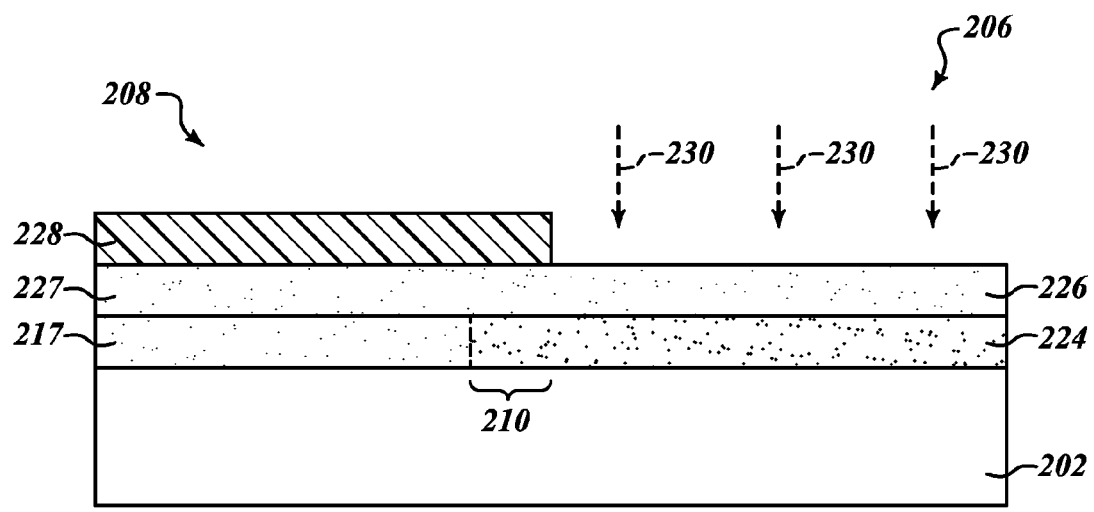

In FIG. 21, a second mask layer 228 is formed and patterned to expose the MEMS region 206 and protect the IC region 208. A fourth dopant 230 is implanted into the second silicon layer 226 to form a second MEMS portion 232. The wafer is subjected to another anneal in order to ensure the dopant is equally distributed through the second MEMS portion 232. The anneal forms the transition region 210 in the second MEMS portion 232. The second anneal also affects the second dopant, which may cause the transition region 210 of the first MEMS portion 224 to expand.

Figure 22:
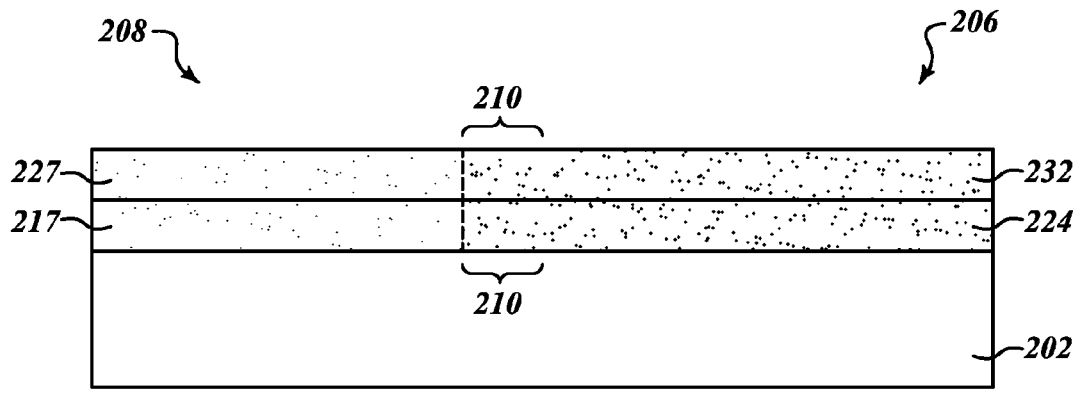

In FIG. 22, the first and second MEMS portions 224, 232 form the MEMS region 206 where a MEMS structure can be formed with known techniques. The first and second MEMS portions 224, 232 may have the same dopant concentration or different dopant concentrations. The first and second IC portions 217 and 227 may be configured to form integrated circuit components directly in the IC portions. A MEMS structure may be formed with the MEMS portions 224, 232 in accordance with known manufacturing techniques.

Figure 23:
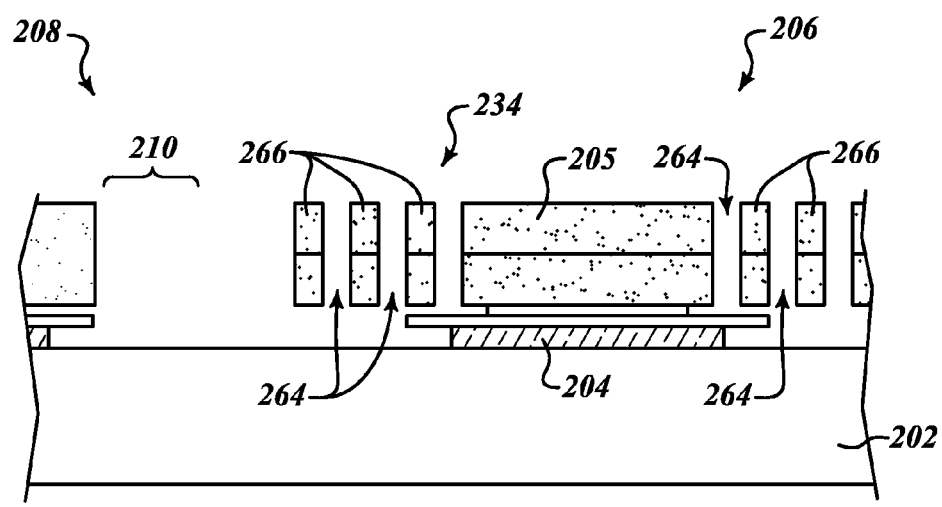
FIG. 23 is a cross-sectional view of a MEMS device adjacent an IC region formed in accordance with the present disclosure.

FIG. 23 is a cross-sectional view of a MEMS device 234 formed in the MEMS region 206 adjacent the IC region 208 formed in accordance with an embodiment of the present disclosure. The MEMS device 234 is formed from known MEMS fabrication techniques that may be achieved with or without an oxide layer.

In one embodiment, a thin thermal oxide 204 may be grown on the substrate 202 in order to form a plurality of suspended MEMS structures 266. The oxide is formed prior to formation of the first and second silicon epitaxial layers 216, 226. After the first and second silicon epitaxial layers 216, 226 are doped and annealed according to the present disclosure, apertures 264 are formed through the MEMS portions 224, 232 to form the suspended MEMS structures 266. An anchored mass remains connected to the substrate 202 through portions of the oxide that are not removed during a release etch.

The suspended MEMS structures 266 may be fingers of an accelerometer or other sensing device. The MEMS structure 234 can be realized in a plurality of epitaxial layers that have a higher dopant concentration in the MEMS region than in the IC region. The MEMS structure 234 is formed next to and in communication with the IC region 208 on a single device, which may result is smaller packages or more efficient use of fabrication equipment.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a first layer having a first dopant concentration overlying a substrate, the first layer having a first portion that corresponds to an integrated circuit region and a second portion that corresponds to a micro-electromechanical region;
    doping the second portion of the first layer to have a second dopant concentration;
    forming a second layer having a third dopant concentration overlying the first layer, the second layer having a first portion that corresponds to the integrated circuit region and a second portion that corresponds to the micro-electromechanical region;
    doping the second portion of the second layer to have a fourth dopant concentration, the doping of the second portions of the first and second layers including:
        forming a transitional region that separates the integrated circuit region from the micro-electromechanical region, the transitional region having a width that is greater than or equal to a depth of the second and fourth dopant concentrations;
    forming a micro-electromechanical structure using the second and fourth dopant concentrations of the micro-electromechanical region of the first and second layers; and
    forming active components using the third dopant concentration of the integrated circuit region of the second layer.

2. The method of claim 1, further comprising forming the first and second layers with an epitaxial process.

3. The method of claim 1, further comprising annealing the first layer and the second layer to distribute the second dopant and the fourth dopant, respectively to the depth and to form the transitional region.

4. The method of claim 1, further comprising:
    determining the width of the transitional region between the micro-electromechanical region and the integrated circuit region that relates to the depth of the second dopant of the first layer; and
    positioning the integrated circuit region spaced from the micro-electromechanical region by at least the width of the transitional region.

5. The method of claim 1 wherein the first and third dopant concentrations are the same concentration.

6. The method of claim 1 wherein the second and fourth dopant concentrations are the same concentration.

7. The method of claim 1 wherein the first and third dopant concentrations are different concentrations.

8. The method of claim 1 wherein the second and fourth dopant concentrations are different concentrations.

9. The method of claim 1 wherein the second and fourth dopant concentrations are higher dopant concentrations than the first and third dopant concentrations, respectively.

10. A device, comprising:
    a substrate;
    a first epitaxial layer overlying the substrate, the first epitaxial layer having a first portion that corresponds to an integrated circuit region and has a first dopant concentration adjacent to a second portion that corresponds to a micro-electromechanical region and has a second dopant concentration, the first dopant concentration being different from the second dopant concentration;

a second epitaxial layer overlying the first epitaxial layer, the second epitaxial layer having a first portion that corresponds to the integrated circuit region and has a third dopant concentration and a second portion that corresponds to the micro-electromechanical region and has a fourth dopant concentration, the third dopant concentration being different from the fourth dopant concentration;

a micro-electromechanical structure formed in the micro-electromechanical region from the first and second layers having the second and fourth dopant concentrations, respectively; and an active area formed in the integrated circuit region from the second layer having the third dopant concentration.

11. The device of claim 10 wherein the second dopant concentration has a higher dopant concentration than the first dopant concentration.

12. The device of claim 10 wherein the substrate is a silicon-on-insulator substrate having a buried oxide layer.

13. The device of claim 12 wherein a portion of the buried oxide layer is removed to form the micro-electromechanical structure.

14. The device of claim 12 wherein the buried oxide layer is formed under the micro-electromechanical region.

15. The device of claim 10 wherein a transitional region forms between the integrated circuit region and the micro-electromechanical region, the transitional region having a width that corresponds to a depth of the second and fourth dopant concentrations.

16. The device of claim 15 wherein the width of the transition region is at least two times the depth of the second dopant concentration.

17. A device, comprising:
a substrate;
a first epitaxial layer overlying the substrate, the first epitaxial layer having an integrated circuit region having a first dopant concentration adjacent to a micro-electromechanical region having a second dopant concentration;
a second epitaxial layer overlying the first epitaxial layer, the second epitaxial layer having a third dopant concentration overlying the integrated circuit region and a fourth dopant concentration overlying the micro-electromechanical region;
a micro-electromechanical structure formed in the micro-electromechanical region from the first and second layers having the second and fourth dopant concentrations, respectively;
an active area formed in the integrated circuit region from the second layer having the third dopant concentration; and
a transitional region between the integrated circuit region and the micro-electromechanical region, the transitional region having a width that is greater than or equal to a depth of the second and fourth dopant concentrations.

18. The device of claim 17 wherein the width of the transition region is at least two times the depth of the second dopant concentration.

19. A method, comprising:
forming a first layer overlying a substrate, the first layer having a first dopant concentration;
doping a first portion of the first layer to have a second dopant concentration while shielding a second portion of the first layer from the doping of the first portion;
forming a second layer overlying the first layer, the second layer having a third dopant concentration;
doping a third portion of the second layer that overlies the first portion of the first layer to have a fourth dopant concentration while shielding a fourth portion of the second layer from the doping of the third portion;
forming a micro-electromechanical structure in the first and third portions of the first and second layers; and
forming semiconductor transistor components in the fourth portion of the second layer.

20. The method of claim 19 wherein all of the semiconductor transistors are spaced from the first and second portions by a distant equal to or greater than a depth of the first and second doping concentrations.

21. The method of claim 19, further comprising forming a transitional region that separates the micro-electromechanical region from the integrated circuit region, the transitional region having a width that is greater than or equal to a depth of the second and fourth dopant concentrations.

22. The method of claim 21 wherein the width of the transition region is at least two times the depth of the second dopant concentration.

* * * * *